United States Patent
Homeijer et al.

(10) Patent No.: US 8,776,337 B2
(45) Date of Patent: Jul. 15, 2014

(54) METHODS OF FORMING CAPACITIVE SENSORS

(75) Inventors: Brian D. Homeijer, Corvallis, OR (US);
Robert G. Walmsley, Palo Alto, CA (US); Rodney L. Alley, Albany, OR (US); Dennis M. Lazaroff, Corvallis, OR (US); Sara J. Homeijer, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 887 days.

(21) Appl. No.: 12/847,734

(22) Filed: Jul. 30, 2010

(65) Prior Publication Data
US 2012/0025851 A1    Feb. 2, 2012

(51) Int. Cl.
*H01G 5/16*    (2006.01)

(52) U.S. Cl.
USPC .......... 29/25.41; 29/25.42; 29/592.1; 29/595; 29/840; 361/280; 73/718

(58) Field of Classification Search
CPC .... G01R 29/12; G01R 15/165; G01P 15/125; G01P 15/0802
USPC ............. 29/592.1, 593, 832, 840, 413–414; 73/514.32, 514.16, 862.625, 718–724; 324/686, 662, 679; 257/415; 361/280–281, 308, 321
See application file for complete search history.

(56) References Cited

U.S. PATENT DOCUMENTS

| | | | |
|---|---|---|---|
| 4,930,042 A | 5/1990 | Wiegand et al. | |
| 5,304,937 A * | 4/1994 | Meyer | 324/686 |
| 6,013,933 A | 1/2000 | Foerstner et al. | |
| 6,041,653 A * | 3/2000 | Ichikawa et al. | 73/514.32 |
| 6,509,620 B2 * | 1/2003 | Hartwell et al. | 257/415 |
| 7,208,857 B2 * | 4/2007 | Fasen | 310/309 |
| 7,484,411 B2 | 2/2009 | Walmsley | |
| 7,570,066 B2 * | 8/2009 | Lee | 324/662 |
| 7,578,189 B1 | 8/2009 | Mehregany | |
| 8,188,555 B2 * | 5/2012 | Igarashi | 257/415 |
| 2009/0261430 A1 | 10/2009 | Suzuki et al. | |
| 2010/0019617 A1 | 1/2010 | Murari et al. | |

FOREIGN PATENT DOCUMENTS

JP        10206170        7/2010

OTHER PUBLICATIONS

Tsai, et al., Design and Application of a Metal Wet-Etching Post-Process for the Improvement of CMOS-MEMS Capacitive Sensors, Journal of Micromechanics and Microengineering, 2009, vol. 19, No. 10, 7 pgs.

* cited by examiner

*Primary Examiner* — Minh Trinh

(57) ABSTRACT

The present disclosure includes methods of forming capacitive sensors. One method includes forming a first electrode array of the capacitive sensor on a first structure. Forming the first electrode array can include: forming a dielectric material on a substrate material; forming an electrode material on the dielectric material; removing portions of the electrode material to form a number of electrodes separated from each other; and removing at least a portion of the dielectric material from between the number of electrodes. The method can include bonding the first structure to a second structure having a second electrode array of the capacitive sensor formed thereon such that the number of electrodes of the first electrode array face a number of electrodes of the second electrode array.

6 Claims, 4 Drawing Sheets

METHODS OF FORMING CAPACITIVE SENSORS

FIELD OF THE INVENTION

The disclosure generally concerns sensing systems and methods. More particularly, the disclosure concerns capacitive sensors.

BACKGROUND

Capacitive sensors can be used to detect various physical quantities such as proximity, position, pressure, and acceleration, among other physical quantities based on capacitive coupling effects between electrodes. Capacitive sensors are present in several products including audio/video players, computer monitors, laptop trackpads, mobile telephones, vehicles, etc.

The physical scale of capacitive sensors can be reduced in order to increase their sensitivity. For instance, the sensitivity of capacitive sensors can be increased by reducing the distance between capacitive sensing electrodes. However, reducing the distance between capacitive sensing electrodes can lead to a reduction in the signal to noise ratio (SNR) associated with capacitive sensors due to a corresponding increase in parasitic capacitance either between sensing electrodes or from sensing electrodes to ground.

DETAILED DESCRIPTION

Capacitive sensors and methods of forming capacitive sensors are described herein. One example of a capacitive sensor includes a first substrate structure having a first dielectric material formed thereon and electrodes of a first electrode array formed on the first dielectric material. The sensor includes a second substrate structure facing the first substrate structure and having a second dielectric material formed thereon and electrodes of a second electrode array formed on the second dielectric material. The sensor includes a removed portion of the first dielectric material forming a recess between adjacent electrodes of the first electrode array, and the first substrate structure is moveable with respect to the second substrate structure.

Figure 1:
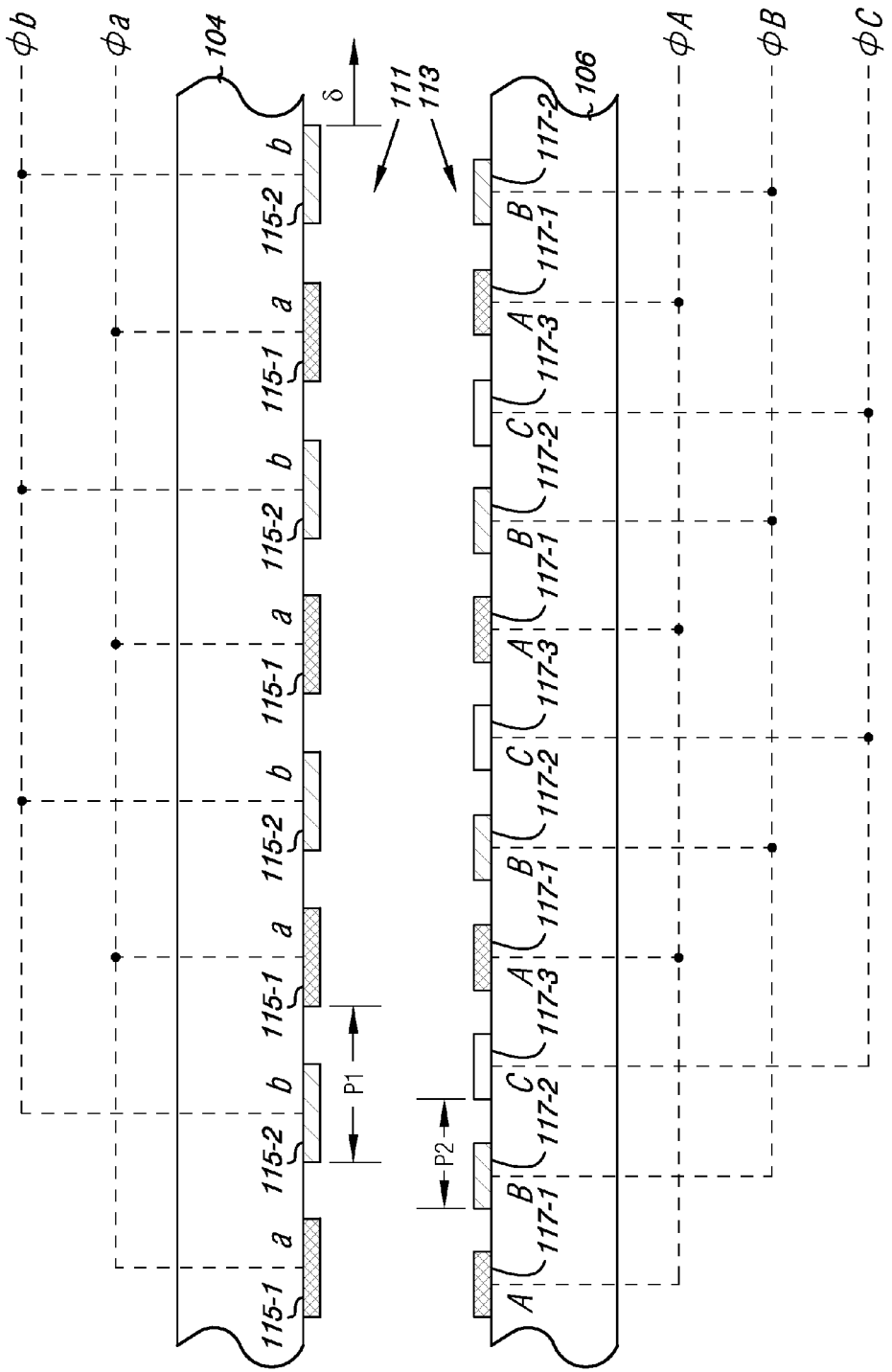
FIG. 1 is a schematic illustrating a portion of a prior art capacitive sensor.

Embodiments of the present disclosure can provide various benefits such as reducing parasitic capacitance associated with capacitive sensors. The reduction in parasitic capacitance increases the SNR associated with the sensor by increasing the ratio of detection capacitance to parasitic capacitance FIG. 1 is a schematic illustrating a cross-sectional view of a portion of a prior art capacitive sensor. The example shown in FIG. 1 includes a first electrode array 111 formed on a translator structure 104 and a second electrode array 113 formed on a stator structure 106. The structures 104 and 106 face each other and the electrode arrays 111 and 113 are separated by a distance D. The translator structure 104 is configured to move laterally with respect to the stator structure 106 (e.g., as indicated by "δ"). In operation, movement of translator structure 104 with respect to stator structure 106 results in capacitance changes between the electrodes of arrays 111 and 113. The capacitance changes can be measured (e.g., by electronics coupled to the arrays 111 and 113 but not shown in FIG. 1) and used to determine a particular physical quantity and/or a change in a particular physical quantity (e.g., acceleration, position, pressure, flow, etc.)

In the sensor shown in FIG. 1, the electrodes of the first array 111 are evenly spaced and have a pitch P1 associated therewith. The electrodes of the second array 113 are also evenly spaced and have a pitch P2 associated therewith. The pitch refers to the distance between adjacent electrodes within a respective electrode array. The first array 111 includes a repeating pattern of two electrodes 115-1 (a) and 115-2 (b). The respective electrodes 115-1 are electrically coupled together and the respective electrodes 115-2 are electrically coupled together. The second array 113 includes a repeating pattern of three electrodes a 117-1 (A), 117-2 (B), and 117-3 (C). The respective electrodes 117-1 are electrically coupled together, the respective electrodes 117-2 are electrically coupled together, and the respective electrodes 117-3 are electrically coupled together.

The pitches P1 and P2 of the first and second electrode arrays 111 and 113, respectively, are specified such that a ratio of the pitch P1 of the first electrode array 111 to the pitch P2 of the second electrode array 113 is substantially equal to 1.5. Such a configuration results in output signals or phases from second electrode array 113 that are separated in phase by 120 degrees, for example (e.g., in response to application of an AC voltage source to the electrode arrays). As illustrated in FIG. 1, the commonly coupled electrodes 115-1 form a first phase φa and the commonly coupled electrodes 115-2 form a second phase φb. The commonly coupled electrodes 117-1 form a phase φA, the commonly coupled electrodes 117-2 form a phase φB, and the commonly coupled electrodes 117-3 form a phase φC, as shown.

The configuration shown in FIG. 1 results in an equivalent circuit (not shown) that includes cross capacitance terms between the first electrode array 111 and second electrode array 113. In this example, the five electrodes 115-1, 115-2, 117-1, 117-2, and 117-3 result in six cross capacitances, which are a function of the displacement δ of the first array 111 relative to the second array 113. The six cross capacitances include the capacitance between electrodes 115-1 and 117-1 ($C_{aA}(\delta)$), 115-1 and 117-2 ($C_{aB}(\delta)$), 115-1 and 117-3 ($C_{aC}(\delta)$), 115-2 and 117-1 ($C_{bA}(\delta)$), 115-2 and 117-2 ($C_{bB}(\delta)$), and between 115-2 and 117-3 ($C_{bC}(\delta)$). Circuitry coupled to the arrays 111 and 113 can be used to determine a particular physical quantity based on changes in these variable cross capacitances due to translation of the arrays 111 and 113 with respect to each other. An example of such circuitry and methods for capacitive sensing using a sensor such as that illustrated in FIG. 1 are described in U.S. Pat. No. 7,484,411, the content of which is hereby incorporated by reference.

As one example, the sensor illustrated in FIG. 1 can be used to sense acceleration. For instance, the sensor can be affixed to a structure, such as a vehicle, that experiences acceleration that one desires to quantify. When the vehicle experiences acceleration, the translator structure 104 moves with respect to the stator structure 106. As such, one or more cross capacitances between the first and second electrode arrays 111 and 113 vary as the arrays shift with respect to each other. The circuitry coupled to the electrode arrays 111 and 113 can generate an acceleration output signal in response to the variable cross capacitance values.

It is noted that other capacitances, such as parasitic capacitances exist (e.g., between adjacent electrodes 115-1 and 115-2 of array 111, between adjacent electrodes 117-1 and 117-2 of array 113, and between adjacent electrodes 117-2 and 117-3 of array 113). Parasitic capacitance can reduce the signal to noise ratio (SNR) associated with capacitive sensors. The sensitivity of capacitive sensors, such as that illustrated in FIG. 1, can be increased by reducing the pitch (e.g., P1 and/or P2) corresponding to the electrode arrays 111 and 113. The increased sensitivity can allow the sensor to sense smaller acceleration changes, for example. However, as the pitch is reduced (e.g., as the distance between adjacent electrodes is reduced), the parasitic capacitance increases, resulting in further decrease in the SNR of the sensor. Therefore, in order to provide increased capacitive sensor performance, it is beneficial to reduce the parasitic capacitance associated with the sensor.

Figure 2A:
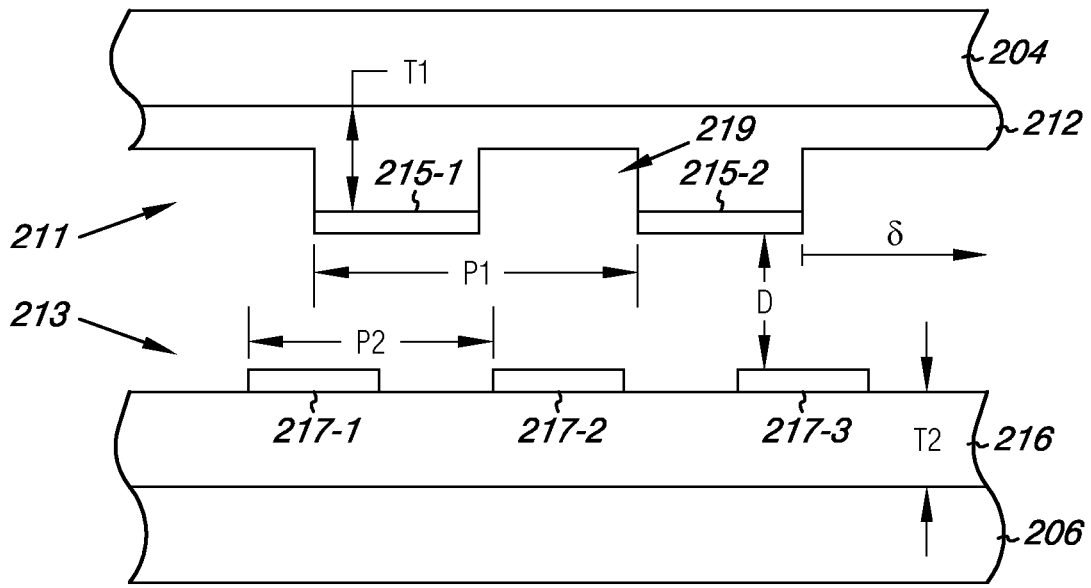
FIG. 2A is a schematic illustrating a portion of a capacitive sensor according to an embodiment of the present disclosure.

FIG. 2A is a schematic illustrating a portion of a capacitive sensor according to an embodiment of the present disclosure. In one example, the capacitive sensor is an acceleration sensor; however, embodiments are not limited to this example. For instance, the sensor illustrated in FIG. 2A can be use to sense various physical quantities such as position, proximity, flow, and/or pressure, among other physical quantities.

The example illustrated in FIG. 2A includes a first substrate structure 204 having a first dielectric material 212 formed thereon. Electrodes 215-1 and 215-2 of a first electrode array 211 are formed on the first dielectric material 212. The first substrate structure can be a silicon (Si) substrate, silicon on insulator (SOI) substrate, or other suitable semiconductor substrate material. In various embodiments, the first dielectric material 212 has a lower dielectric constant than the first substrate structure 204. As an example, the first dielectric material 212 can be TEOS (tetraethyl orthosilicate) which has a dielectric constant of about 3.9, as compared to silicon which has a dielectric constant of about 11 and air which has a dielectric constant of about 1. The electrodes 215-1 and 215-2 can be a conductive material or a combination of conductive materials including tantalum, tungsten, copper, iridium, and/or platinum, for example.

The first dielectric material 212 has a thickness T1 that can be between about 1-3 microns. In one example, the thickness T1 is at least 2 microns; however, embodiments are not limited to a particular thickness T1. As described further below, the thickness T1 of the first dielectric material 212 beneath the electrodes 215-1 and 215-2 of the first electrode array 211 can be selected such that electrical energy within the first substrate structure 204, and associated with a parasitic capacitance between adjacent electrodes 215-1 and 215-2 of the first electrode array 211, is substantially eliminated. That is, the thickness T1 can sufficient such that the parasitic capacitance does not have a path through the substrate structure 204.

A second substrate structure 206 faces the first substrate structure 204. The second substrate structure has a second dielectric material 216 formed thereon. Electrodes 217-1, 217-2, and 217-3 of a second electrode array 213 are formed on the second dielectric material 216. The second substrate structure can also be a silicon (Si) substrate, silicon on insulator (SOI) substrate, or other suitable semiconductor substrate material. In various embodiments, the second dielectric material 216 has a lower dielectric constant than the second substrate structure 206. As an example, the second dielectric material 216 can be TEOS. The second dielectric material 216 has a thickness T2 that can be between about 1-3 microns, for example.

The electrodes 215-1 and 215-2 of the first array 211 are separated from the electrodes 217-1, 217-2, and 217-3 of the second array 213 by a distance D. The distance D can be substantially uniform and can be about 1-3 microns, among other suitable distances. The space between the electrode arrays 211 and 213 can be air, although embodiments are not limited to a particular material separating the electrode arrays 211 and 213.

The first electrode array 211 has a pitch P1 and the second electrode array 213 has a pitch P2. The pitch P1 can be different that the pitch P2. For instance, in the example illustrated in FIG. 2A, the pitch P1 is greater than the pitch P2.

The first substrate structure 204 is moveable with respect to the second substrate structure 206. As an example, the first substrate structure 204 can be a translator structure (e.g., a mobile structure) and the second substrate structure 206 can be a stator structure (e.g., a fixed structure). The translator structure 206 can shift laterally with respect to the stator structure 206 (e.g., as indicated by "δ"). As described above in connection with FIG. 1, movement of the structures 204 and 206 with respect to each other results in capacitance changes between the electrode arrays 211 and 213. For instance, cross capacitances between electrodes 215-1 and 217-1, 215-1 and 217-2, 215-1 and 217-3, 215-2 and 217-1, 215-2 and 217-2, and between 215-2 and 217-3 can vary based on the translation amount δ. These cross capacitances may be referred to herein as detection capacitors. The electrodes of the arrays 211 and 213 can be coupled to circuitry (e.g., electronics 403 illustrated in FIG. 4), which can determine cross capacitance values and provide an output signal indicative of a particular sensed quantity (e.g., acceleration, position, flow, pressure, etc.)

Unlike the example illustrated in FIG. 1, the capacitive sensor illustrated in FIG. 2A includes a recess 219 (e.g., a gap) formed between the adjacent electrodes 215-1 and 215-2 of array 211. As described further below in connection with FIGS. 3A-3C, the gap 219 can be formed by removal (e.g., via etching) of dielectric material 212 between the adjacent electrodes 215-1 and 215-2. The gap 219 formed between the adjacent electrodes 215-1 and 215-2 can reduce the parasitic capacitance as compared to previous capacitive sensors. The parasitic capacitance is reduced, for instance, because there is less electrical energy in the dielectric material 212 between the adjacent electrodes 215-1 and 215-2 when the gap 219 is present (e.g., since the air in gap 219 has a lower dielectric constant than the dielectric material 212). Also, since the medium (e.g., air) between the detection capacitors (e.g., in the space between the first and second electrode arrays 211 and 213) is the same as the medium between the parasitic capacitances associated with adjacent electrodes, the ratio of detection capacitance to parasitic capacitance is increased. Therefore, the SNR associated with the sensor is increased.

Figure 2B:
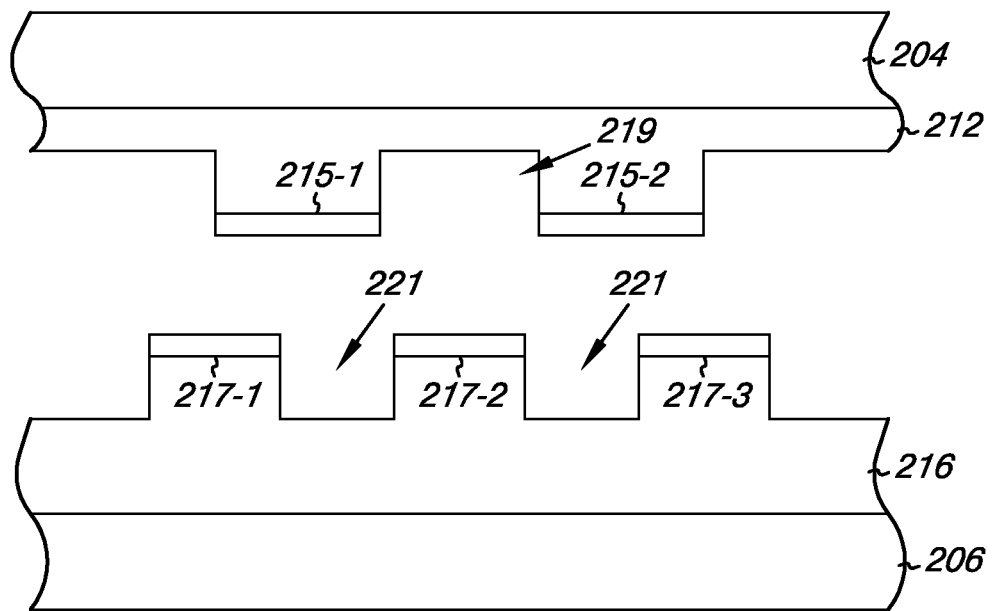
FIG. 2B is a schematic illustrating a portion of a capacitive sensor according to an embodiment of the present disclosure.

FIG. 2B is a schematic illustrating a portion of a capacitive sensor according to an embodiment of the present disclosure. The capacitive sensor illustrated in FIG. 2B is similar to the capacitive sensor illustrated in FIG. 2A. However, the example illustrated in FIG. 2B includes recesses 221 (e.g., gaps) formed between adjacent electrodes of the second electrode array 213 (e.g., gap 221 between adjacent electrodes 217-1 and 217-2 and gap 221 between adjacent electrodes 217-2 and 217-3).

The example illustrated in FIG. 2B can further reduce parasitic capacitance effects associated with the capacitive sensor as compared to previous sensors. For instance, similar to the example illustrated in FIG. 2A, the thickness T2 of the dielectric material 216 can be sufficient to reduce and or eliminate the electrical energy present in the substrate 206 (e.g., such that the parasitic capacitance does not have a path through the substrate 206). Also, the gaps 221 between adjacent electrodes of the array 213 can further reduce parasitic effects between adjacent electrodes of array 213 due to the medium (e.g., air) within gaps 221 being the same as the medium between the arrays 211 and 213.

Figure 3A:
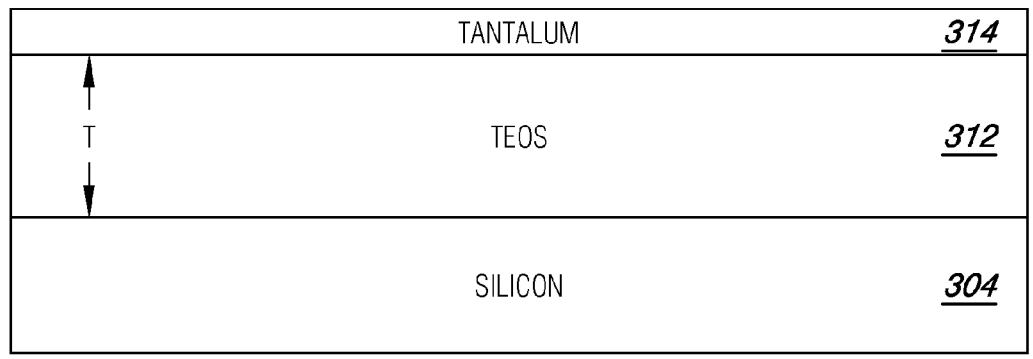
FIGS. 3A-3C illustrate processing steps associated with forming a capacitive sensor in accordance with an embodiment of the present disclosure.
Figure 3B:
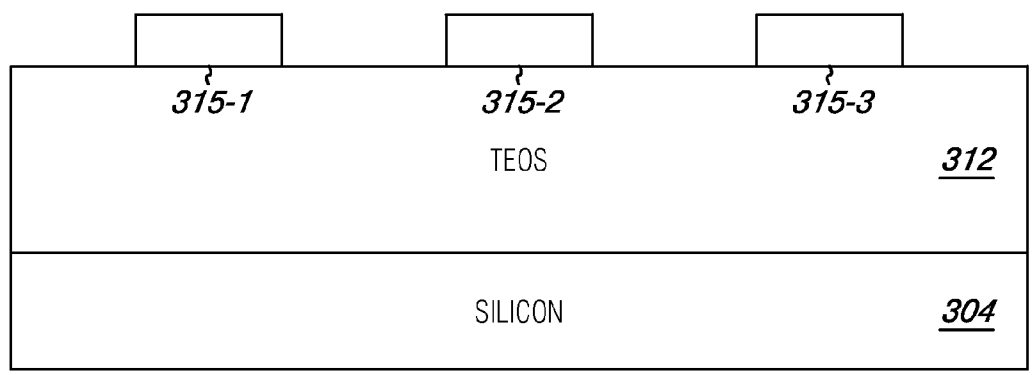
Figure 3C:
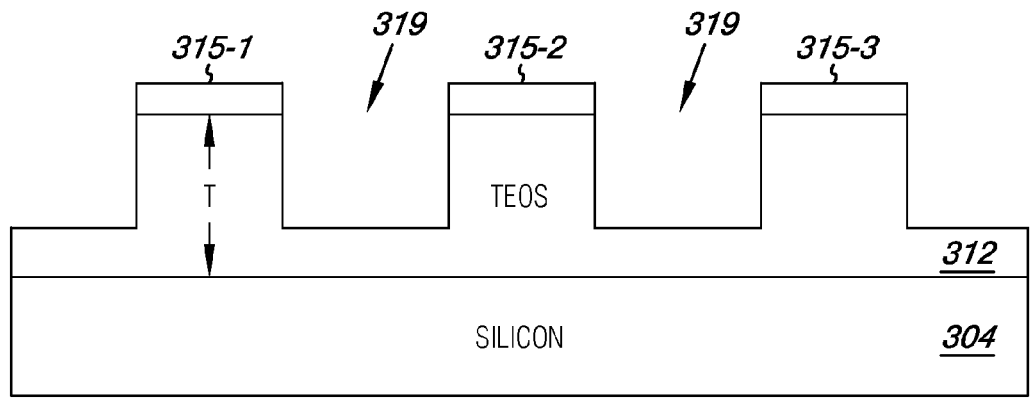

FIGS. 3A-3C illustrate processing steps associated with forming a capacitive sensor in accordance with an embodiment of the present disclosure. In various embodiments, forming a capacitive sensor structure includes forming a dielectric material on a substrate material and forming an electrode material on the dielectric material. In the example illustrated in FIG. 3A, the substrate material 304 is silicon, the dielectric material is TEOS having a thickness T, and the electrode material 314 is tantalum. However, embodiments are not limited to this example.

As discussed above in connection with FIG. 2A, the thickness T of the dielectric material 312 can be selected such that is sufficient to substantially eliminate electrical energy within the substrate material 304 resulting from parasitic capacitance between adjacent electrodes 315-1, 315-2, and 315-3 of the electrode array. As an example, the dielectric material 312 has a thickness T of at least two microns, in some embodiments.

FIG. 3B illustrates the sensor structure of FIG. 3A subsequent to removal of portions of the electrode material 314 in order to form a number of electrodes 315-1, 315-2, and 315-3 separated from each other. As an example, the electrodes 315-1, 315-2, and 315-3 can be formed by a patterning and etching process (e.g., by patterning the tantalum 314 and performing a chlorine (Cl) dry etch).

In various embodiments, forming a capacitive sensor structure includes removing at least a portion of the dielectric material from between the number of electrodes. For instance, FIG. 3C illustrates the structure shown in FIG. 3B subsequent to formation of recesses 319 formed in the TEOS 312 between the electrodes 315-1, 315-2, and 315-3. In this example, forming the recesses 319 includes performing an etch process in which the tantalum 314 of electrodes 315-1, 315-2, and 315-3 is used as a hard mask. As an example, a fluorine etch can be performed to create the recesses 319. The depth of the recesses 319 can be about 1-3 microns; however, embodiments are not limited to a particular depth. Using the electrode material 314 as a hard mask can provide benefits such as reducing the number of processing steps (e.g., masking and etching) associated with forming capacitive electrode arrays, among other benefits.

The sensor structure illustrated in FIG. 3C can be a translator structure that is moveable with respect to a stator structure, as described above. For instance, the sensor structure shown in FIG. 3C can be bonded to a second sensor structure such that the electrodes of the respective electrode arrays of the sensor structures face each other and are separated by a uniform distance (e.g., distance D shown in FIG. 2A). As illustrated in FIG. 2B, the electrode array of the second sensor structure (e.g., array 213 shown in FIG. 2A) can also be formed by forming a dielectric material on a substrate material, forming an electrode material on the dielectric material, removing portions of the electrode material to form the number of electrodes and removing at least a portion of the dielectric material from between the number of electrodes by performing an etch in which the number of electrodes of the second array are used as a mask.

Figure 4:
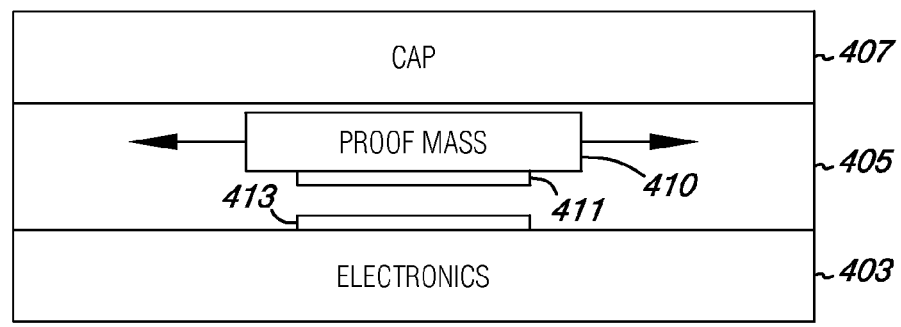
FIG. 4 is a schematic illustrating a capacitive sensor according to an embodiment of the present disclosure.

FIG. 4 is a schematic illustrating a capacitive sensor 400 according to an embodiment of the present disclosure. The sensor 400 can be used to detect various physical quantities including position, proximity, acceleration, flow, and/or pressure, among various other physical quantities. In this example, the sensor 400 includes three physical structures, which may be referred to as "wafers." The structures include an electronics structure 403, a proof mass structure 405, and a cap structure 407.

The electronics structure 403 can include CMOS electronics and may be electrically coupled to various electrical components in the proof mass structure 405 and/or cap structure 407. The electronics structure 403 can also provide input/output ports (not shown) for coupling to electronic components external to sensor 400.

Although not shown in FIG. 4, the proof mass structure 405 can include a support structure and a number of suspension elements mechanically coupled to a proof mass 410. As such, the proof mass 410 can be suspended above the electronics structure 405 and can move laterally with respect to the electronics structure 405.

A first electrode array 411 is formed on the proof mass 410. The first electrode array 411 can be an array such as array 211 illustrated in FIGS. 2A and 2B, for example. A second electrode array 413 is formed on the electronics structure 403. The second electrode array can be an array such as array 213 illustrated in FIGS. 2A and 2B. As illustrated in FIG. 4, the sensor 400 is configured such that the first and second electrode array 411 and 413 face each other and are separated by a substantially uniform distance.

In operation, sensor 400 can be affixed to various structures such as a vehicle, a mobile device, a computer, or other structure that may experience a change that one desires to quantify (e.g., a change in acceleration). As described above, the movement of the electrodes of arrays 411 and 413 with respect to each other results in variances in cross capacitance between the arrays. These capacitance variances can be sensed by electronics within structure 403 and/or external to the sensor 400, for example. Such circuitry can provide output signals proportional to the acceleration change experienced by the sensor 400.

In some embodiments, a closed loop circuit may be employed to maintain the proof mass 410 at a predetermined position during acceleration. Such circuitry can apply actuation signals to cause the proof mass 410 to remain at the predetermined position based on position feedback from the arrays 411 and 413.

The electrode array 411 and/or the electrode array 413 can be formed according to the methods described in connection with FIGS. 3A-3C, for example. As such, the capacitive sensor 400 can have an increased SNR as compared to previous capacitive sensors due to decreases in parasitic capacitance associated with the sensor 400.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one.

Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of forming a capacitive sensor, the method comprising:
    forming a first electrode array of the capacitive sensor on a first structure, wherein forming the first electrode array includes:
        forming a dielectric material on a substrate material;
        forming an electrode material on the dielectric material;
        removing portions of the electrode material to form a number of electrodes separated from each other; and
        removing at least a portion of the dielectric material from between the number of electrodes; and
    bonding the first structure to a second structure having a second electrode array of the capacitive sensor formed thereon such that the number of electrodes of the first electrode array face a number of electrodes of the second electrode array.

2. The method of claim 1, including performing an etch in which the number of electrodes are used as a mask to remove the at least a portion of the dielectric material from between the number of electrodes.

3. The method of claim 1, including forming the dielectric material on the substrate material such that a thickness of the dielectric material is sufficient to substantially eliminate electrical energy within the substrate material resulting from parasitic capacitance between adjacent electrodes of the first electrode array.

4. The method of claim 1, including forming the dielectric material to a thickness of at least two microns.

5. The method of claim 1, including forming the capacitive sensor such that the first electrode array is moveable with respect to the second electrode array, wherein changes in capacitance between the electrodes of the first array and the electrodes of the second array correspond to a detectable physical quantity.

6. The method of claim 1, including forming the second electrode array on the second structure by:

forming a dielectric material on a substrate material;

forming an electrode material on the dielectric material;

removing portions of the electrode material to form the number of electrodes of the second array; and removing at least a portion of the dielectric material from between the number of electrodes by performing an etch in which the number of electrodes of the second array are used as a mask.

\* \* \* \* \*